United States Patent
Zhang et al.

(10) Patent No.: US 7,681,172 B2
(45) Date of Patent: Mar. 16, 2010

(54) METHOD AND APPARATUS FOR MODELING AN APODIZATION EFFECT IN AN OPTICAL LITHOGRAPHY SYSTEM

(75) Inventors: Qiaolin Zhang, Union City, CA (US);
Paul VanAdrichem, Cupertino, CA (US); Laurent Depre, Revel (FR);
Qiliang Yan, Portland, OR (US)

(73) Assignee: Synopsys, Inc., Mountain View, CA (US)

( * ) Notice: Subject to any disclaimer, the term of this patent is extended or adjusted under 35 U.S.C. 154(b) by 428 days.

(21) Appl. No.: 11/699,805

(22) Filed: Jan. 29, 2007

(65) Prior Publication Data

US 2008/0184192 A1 Jul. 31, 2008

(51) Int. Cl.
*G06F 17/50* (2006.01)
*G03F 1/00* (2006.01)
*G03C 5/00* (2006.01)

(52) U.S. Cl. ............................... 716/19; 716/4; 716/21; 430/5; 430/30

(58) Field of Classification Search ................... 716/19, 716/21; 430/5, 320; 355/53, 67, 71
See application file for complete search history.

(56) References Cited

U.S. PATENT DOCUMENTS

| | | | |
|---|---|---|---|
| 5,450,352 A * | 9/1995 | Ftaclas et al. | 356/124.5 |
| 6,282,963 B1 * | 9/2001 | Haider | 73/602 |
| 6,363,033 B1 * | 3/2002 | Cole et al. | 367/138 |
| 6,864,043 B2 * | 3/2005 | Neal et al. | 430/320 |
| 7,010,776 B2 * | 3/2006 | Gallatin et al. | 716/19 |
| 7,068,884 B2 * | 6/2006 | Rothenberg | 385/37 |
| 7,099,555 B2 * | 8/2006 | Onuki et al. | 385/147 |
| 7,123,356 B1 * | 10/2006 | Stokowski et al. | 356/237.2 |
| 7,131,104 B2 * | 10/2006 | Gallatin et al. | 716/19 |
| 7,133,119 B1 * | 11/2006 | Pettibone et al. | 355/71 |
| 7,224,430 B2 * | 5/2007 | Dierichs | 355/53 |
| 7,253,376 B2 * | 8/2007 | Zhang et al. | 219/121.73 |
| 7,328,424 B2 * | 2/2008 | Kohle | 716/19 |
| 7,376,308 B2 * | 5/2008 | Cheben et al. | 385/37 |
| 7,443,485 B2 * | 10/2008 | Van De Kerkhof et al. | 355/67 |
| 7,501,212 B2 * | 3/2009 | Lai et al. | 430/5 |
| 2001/0051771 A1 * | 12/2001 | Bradley et al. | 600/443 |
| 2005/0015233 A1 * | 1/2005 | Gordon | 703/13 |
| 2006/0206851 A1 * | 9/2006 | Van Wingerden et al. | 716/19 |
| 2007/0082272 A1 * | 4/2007 | Mann et al. | 430/5 |
| 2007/0193354 A1 * | 8/2007 | Felix et al. | 73/514.32 |
| 2008/0220376 A1 * | 9/2008 | Satake | 430/319 |

* cited by examiner

*Primary Examiner*—Helen Rossoshek
(74) *Attorney, Agent, or Firm*—Park, Vaughan & Fleming LLP (57) ABSTRACT

One embodiment of the present invention provides a system that accurately predicts an apodization effect in an optical lithography system for manufacturing an integrated circuit. During operation, the system starts by collecting an apodization-effect-induced spatial transmission profile from the optical lithography system. The system then constructs an apodization model based on the spatial transmission profile. Next, the system enhances a lithography model for the optical lithography system by incorporating the apodization model into the lithography model, wherein the enhanced lithography model accurately predicts the effects of apodization on the optical lithography system.

23 Claims, 9 Drawing Sheets

METHOD AND APPARATUS FOR MODELING AN APODIZATION EFFECT IN AN OPTICAL LITHOGRAPHY SYSTEM

BACKGROUND

1. Field of the Invention

The present invention relates to the process of semiconductor manufacturing. More specifically, the present invention relates to a method and an apparatus for accurately modeling an apodization effect or lens transmission behavior in an optical lithography system which is used in semiconductor manufacturing.

2. Related Art

Semiconductor manufacturing technologies typically include a number of processes which involve complex physical and chemical interactions. Since it is almost impossible to find exact formulae to predict the behavior of these complex interactions, developers typically use process models which are fit to empirical data to predict the behavior of these processes. A process model can be used in a number of applications during the design of a semiconductor chip.

For example, in a technique which is referred to as "Optical Proximity Correction" (OPC), a process model is used to make corrections to a semiconductor chip layout to compensate for undesirable effects of semiconductor manufacturing processes. An OPC model is typically composed of a physical optical model and an empirical process model. An OPC simulation engine uses the OPC model to iteratively evaluate and modify edge segments in the mask layout. In doing so, the OPC simulation engine computes the correct mask patterns which produce physical patterns on wafer that closely match a desired design layout. Note that the effectiveness of the corrected mask patterns is typically limited by the accuracy of the OPC model.

Currently, semiconductor manufacturers are using lithography systems with numerical apertures (NA) near 1 or even larger than 1 (referred to as "hyper-NA"), while continuously pushing ever larger NAs to achieve increasingly smaller critical dimensions (CDs). Existing OPC models are capable of modeling many high-NA related optical effects such as: thin-film energy coupling, vector diffraction, polarization illumination, and immersion imaging. Unfortunately, none of these existing OPC models can accurately predict pupil apodization effects in such lithography systems.

An apodization effect is a lens optical transmission attenuation effect which is caused by imperfections in optical components (e.g., absorption, size and shape of the lens pupil). Apodization effects can cause frequency-dependent amplitude or intensity attenuation especially in high-spatial-frequency region in the lens pupil. Note that the high-spatial-frequency components are typically important to the image formation or printing of design features with small critical dimensions. Hence, the apodization effects are becoming a limiting factor in the lithography process as feature sizes continue to shrink.

Existing OPC modeling techniques approximate the apodization effect by using an ideal Gaussian model with a single tunable parameter, i.e., Gaussian Sigma ($\sigma$). However, this single parameter ideal Gaussian model does not suffice to predict the measured transmission attenuation for the actual apodization effect. More specifically, no single $\sigma$ value can be found to reasonably fit this ideal Gaussian model to match the entire spatial frequency spectrum of the transmission data. For example, it has been observed that an ideal Gaussian apodization model can cause greater than 5 nm or even 15 nm CD errors when it is used in a 65 nm-node benchmark test.

Furthermore, an ideal Gaussian apodization model is commonly regressed simultaneously with other parameters from non-optical models to calibrate a multi-parameter OPC model. However, this multi-dimensional optimization technique typically changes the value of the apodization parameter $\sigma$. Additionally, because the ideal Gaussian model is inherently inaccurate, this multi-variable regression approach can cause additional OPC model inaccuracy or distortion because other non-optical OPC model components, such as resist model or etch model components, can be unintentionally distorted to compensate for the inaccuracy in the OPC optical model. Note that such a divergence of empirical resist or etch model from the real physical behavior is usually extremely difficult to detect based on a limited training data set, and can pose a serious risk to overall OPC model stability and accuracy.

Hence, what is needed is a method and an apparatus to accurately model an apodization effect in an optical lithography system without the above described problems.

SUMMARY

One embodiment of the present invention provides a system that accurately predicts an apodization effect in an optical lithography system for manufacturing an integrated circuit. During operation, the system starts by collecting an apodization-effect-induced spatial transmission profile from the optical lithography system. The system then constructs an apodization model based on the spatial transmission profile. Next, the system enhances a lithography model for the optical lithography system by incorporating the apodization model into the lithography model, wherein the enhanced lithography model accurately predicts the effects of apodization on the optical lithography system.

In a variation on this embodiment, the system collects the spatial transmission profile by measuring transmission coefficient at a lens pupil of the optical lithography system.

In a further variation on this embodiment, the system measures the transmission coefficient at the lens pupil of the optical lithography system by mapping a transmission profile along a radial direction of the lens pupil.

In a further variation, the system constructs the apodization model based on the spatial transmission profile by constructing a piece-wise apodization model based on the transmission profile.

In a further variation, the system constructs the piece-wise model apodization based on the transmission profile by: partitioning the transmission profile into a series of sectional profiles; and fitting a sectional sub-model to each of the sectional profiles to obtain the piece-wise apodization model, which comprises a series of sectional sub-models.

In a further variation, the sectional sub-model can include a trapezoid sub-model and a step-shape sub-model.

In a further variation, the system partitions the transmission profile by: partitioning the transmission profile along the magnitude direction of the transmission profile; or partitioning the transmission profile along the radial direction of the transmission profile.

In a further variation, the system measures the transmission coefficient at the lens pupil of the optical lithography system by mapping a two-dimensional (2D) transmission profile into a pixellized transmission profile at the lens pupil.

In a further variation, the system constructs the apodization model based on the transmission profile by constructing a pixellized 2D apodization model based on the 2D transmission profile.

In a further variation, the system constructs the apodization model by fitting an enhanced Gaussian model based on the transmission profile, wherein the enhanced Gaussian model can be expressed as: Apodization=$e^{-C(\rho \cdot \sigma)^n}$, wherein $\rho$ is the normalized radial position, $\sigma$ and n are two fitting parameters, wherein $\sigma$ is the Gaussian Sigma and n controls an attenuation rate of the transmission coefficient, and C is a predetermined positive value.

In a variation on this embodiment, the system enhances the lithography model using the apodization model by incorporating the apodization model into a lens pupil function of the optical lithography system.

In a variation on this embodiment, the system uses the enhanced lithography model in an optical proximity correction (OPC) process, wherein the enhanced lithography model includes a fixed apodization model.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

Integrated Circuit Design Flow

Figure 1:
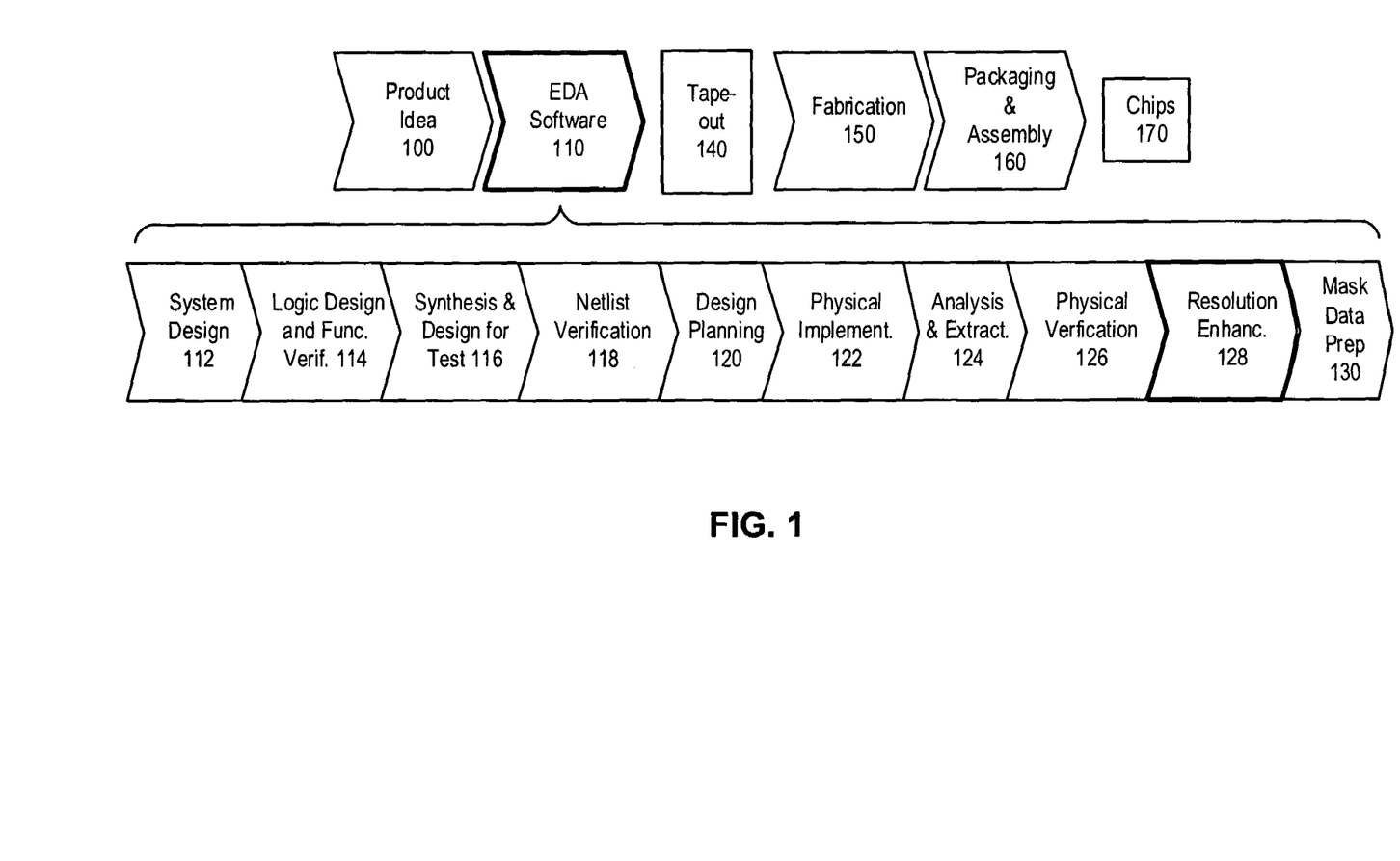
FIG. 1 illustrates various steps in the design and fabrication of an integrated circuit in accordance with an embodiment of the present invention.

FIG. 1 illustrates various steps in the design and fabrication of an integrated circuit in accordance with an embodiment of the present invention.

The process starts with the product idea (step 100) which is realized using an EDA software design process (step 110). When the design is finalized, it can be taped-out (event 140). After tape out, the fabrication process (step 150) and packaging and assembly processes (step 160) are performed which ultimately result in finished chips (result 170).

The EDA software design process (step 110), in turn, comprises steps 112-130, which are described below. Note that the design flow description is for illustration purposes only. This description is not meant to limit the present invention. For example, an actual integrated circuit design may require the designer to perform the design steps in a different sequence than the sequence described below. The following discussion provides further details of the steps in the design process.

System design (step 112): The designers describe the functionality that they want to implement. They can also perform what-if planning to refine functionality, check costs, etc. Hardware-software architecture partitioning can occur at this stage. Exemplary EDA software products from Synopsys, Inc. that can be used at this step include Model Architect, Saber, System Studio, and DesignWare® products.

Logic design and functional verification (step 114): At this stage, the VHDL or Verilog code for modules in the system is written and the design is checked for functional accuracy. More specifically, the design is checked to ensure that it produces the correct outputs. Exemplary EDA software products from Synopsys, Inc. that can be used at this step include VCS, VERA, DesignWare®, Magellan, Formality, ESP and LEDA products.

Synthesis and design for test (step 116): Here, the VHDL/Verilog is translated to a netlist. The netlist can be optimized for the target technology. Additionally, tests can be designed and implemented to check the finished chips. Exemplary EDA software products from Synopsys, Inc. that can be used at this step include Design Compiler®, Physical Compiler, Test Compiler, Power Compiler, FPGA Compiler, Tetramax, and DesignWare® products.

Netlist verification (step 118): At this step, the netlist is checked for compliance with timing constraints and for correspondence with the VHDL/Verilog source code. Exemplary EDA software products from Synopsys, Inc. that can be used at this step include Formality, PrimeTime, and VCS products.

Design planning (step 120): Here, an overall floorplan for the chip is constructed and analyzed for timing and top-level routing. Exemplary EDA software products from Synopsys, Inc. that can be used at this step include Astro and IC Compiler products.

Physical implementation (step 122): The placement (positioning of circuit elements) and routing (connection of the same) occurs at this step. Exemplary EDA software products from Synopsys, Inc. that can be used at this step include the Astro and IC Compiler products.

Analysis and extraction (step 124): At this step, the circuit function is verified at a transistor level, this in turn permits what-if refinement. Exemplary EDA software products from Synopsys, Inc. that can be used at this step include AstroRail, PrimeRail, Primetime, and Star RC/XT products.

Physical verification (step 126): In this step, the design is checked to ensure correctness for manufacturing, electrical issues, lithographic issues, and circuitry. Exemplary EDA software products from Synopsys, Inc. that can be used at this step include the Hercules product.

Resolution enhancement (step 128): This step involves geometric manipulations of the layout to improve manufacturability of the design. Exemplary EDA software products from Synopsys, Inc. that can be used at this step include Progen, Proteus, ProteusAF, and PSMGen products.

Mask data preparation (step 130): This step provides the "tape-out" data for production of masks to produce finished chips. Exemplary EDA software products from Synopsys, Inc. that can be used at this step include the CATS(R) family of products.

Embodiments of the present invention can be used during one or more of the above described steps. Specifically, one embodiment of the present invention can be used during the resolution enhancement step 128.

Terminology

Throughout the specification, the following terms take the meanings provided herein, unless the context clearly dictates otherwise. The term "transmission" means "transmission coefficient", which is a measure of how much of an electromagnetic wave (light) passes through an optical lithography system. Note that transmission coefficients can be calculated for either the amplitude or the intensity of the transmitting light. Either can be calculated by taking the ratio of the value after a surface or an element to the value before. Hence the transmission has a value between 0 and 1. The terms "pupil" and "lens pupil" mean a virtual aperture at the lens plane of the projection lens of the lithography system, wherein the light cannot pass through the projection lens except through the pupil.

Optical Lithography System and Apodization Effect

Figure 2A:
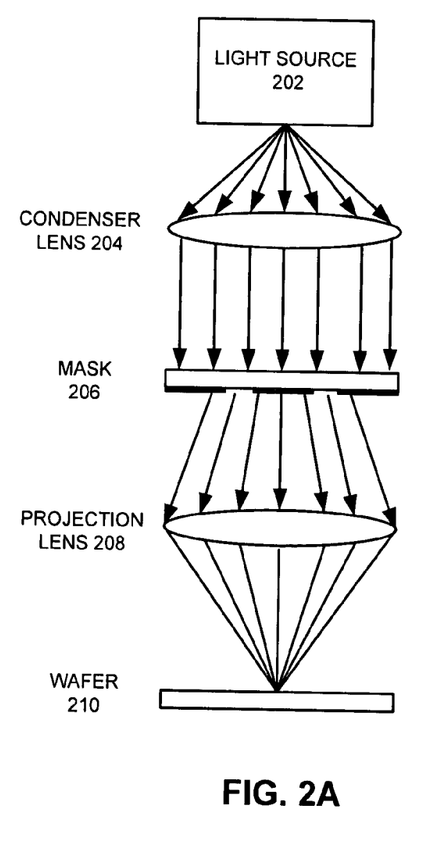
FIG. 2A illustrates a typical optical lithography system in accordance with an embodiment of the present invention.

FIG. 2A illustrates a typical optical lithography system in accordance with an embodiment of the present invention. As shown in FIG. 2A, radiation emanates from light source 202, which can be any suitable source of radiation such as a laser. This radiation passes through condenser lens 204, and then through mask 206. Mask 206 defines integrated circuit patterns (i.e., reticles) to be printed (i.e., fabricated) onto wafer 210. The image of mask 206 passes through projection lens 208, which directs the image onto wafer 210. Wafer 210 is a semiconductor wafer treated with a photoresist layer, or more generally any item to be exposed by the system. During operation, the above-described system transfers circuitry defined by mask 206 onto wafer 210.

Note that projection lens 208 can include a series of lenses designed to achieve a high NA. Furthermore, the complex lenses in projection lens 208 facilitate achieving a maximal transmission of all spatial frequencies through the lens pupil. However, due to the imperfections of projection lens 208, actual optical transmission through the lens pupil experiences attenuation (i.e., the apodization effect) particularly in the high spatial frequency spectrum.

Figure 2B:
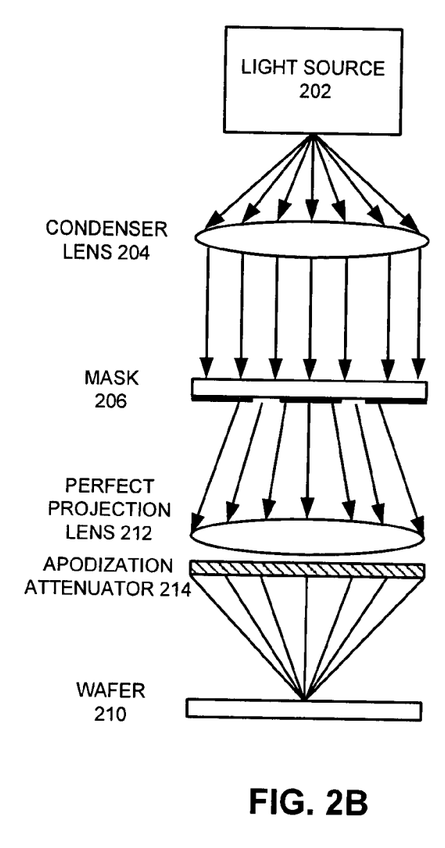
FIG. 2B illustrates the process of modeling the apodization effect of a projection lens as a separate apodization model in accordance with an embodiment of the present invention.

FIG. 2B illustrates the process of modeling the apodization effect of projection lens 208 in FIG. 2A as a separate apodization model in accordance with an embodiment of the present invention. Note that the imperfect projection lens 208 in FIG. 2A is modeled as a perfect projection lens 212, which has no apodization-related transmission attenuation, and an apodization filter (i.e., an apodization model) 214 placed at the lens pupil of perfect projection lens 212, which is responsible for all spatial frequency attenuations. We describe various models for apodization filter (i.e., model) 214 below.

Figure 3A:
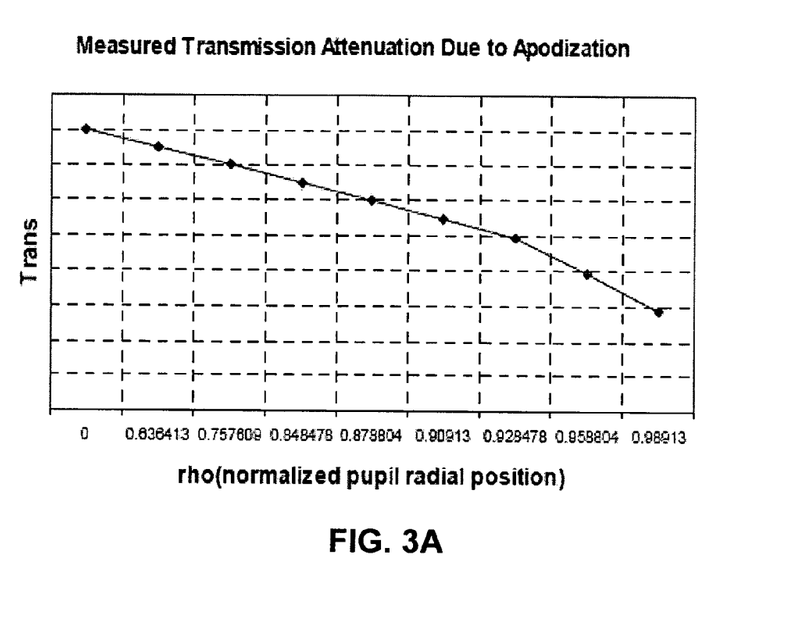
FIG. 3A illustrates a measured apodization-induced pupil transmission as a function of normalized pupil radial positions in accordance with an embodiment of the present invention.

FIG. 3A illustrates a measured apodization-induced pupil transmission as a function of normalized pupil radial positions in accordance with an embodiment of the present invention. Note that the overall pupil transmission profile has a radial dependence that is the highest (lowest in terms of attenuation) at the center of the lens ($\rho=0$) and becomes gradually lower (i.e., increasing in attenuation) toward the edge of the lens ($\rho=1$), wherein $\rho$ is the normalized pupil radial position. This apodization-induce transmission profile is essentially a "low-pass" filter which creates larger attenuation for higher spatial frequencies.

Figure 3B:
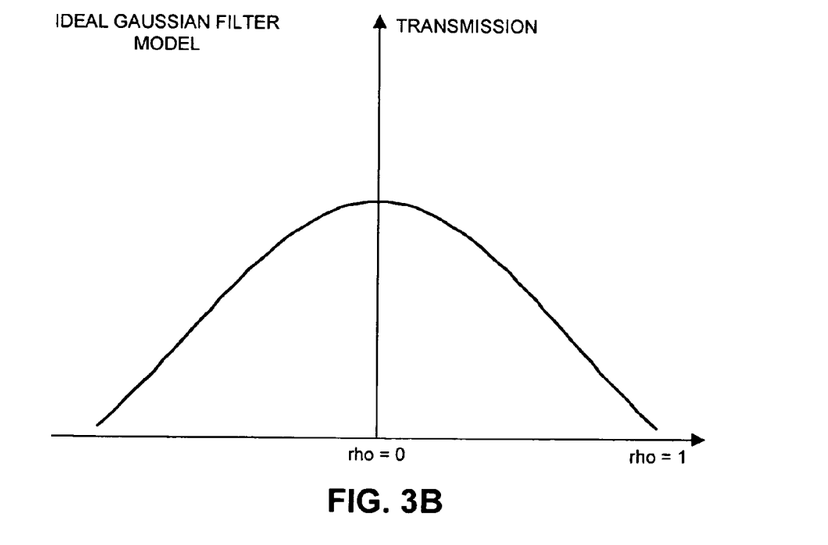
FIG. 3B illustrates a pupil transmission profile based on the ideal Gaussian model in accordance with an embodiment of the present invention.

FIG. 3B illustrates a pupil transmission profile based on the ideal Gaussian model in accordance with an embodiment of the present invention. This ideal Gaussian transmission profile provides an approximation to the apodization-induced attenuation as a function of $\rho$ using a single fitting parameter—Gaussian Sigma $\sigma$:

$$\text{Apodization} = e^{-\frac{1}{2}(rho \cdot \sigma)^2}. \tag{1}$$

Note that this transmission profile is highest at the center of the pupil, but decreases with distance away from the center following a Gaussian function.

As mentioned in the background section, this apodization model cannot accurately fit the measured transmission data, and therefore is not a desirable apodization model 214.

Correcting the Apodization Effect in the Lithography System

Figure 4:
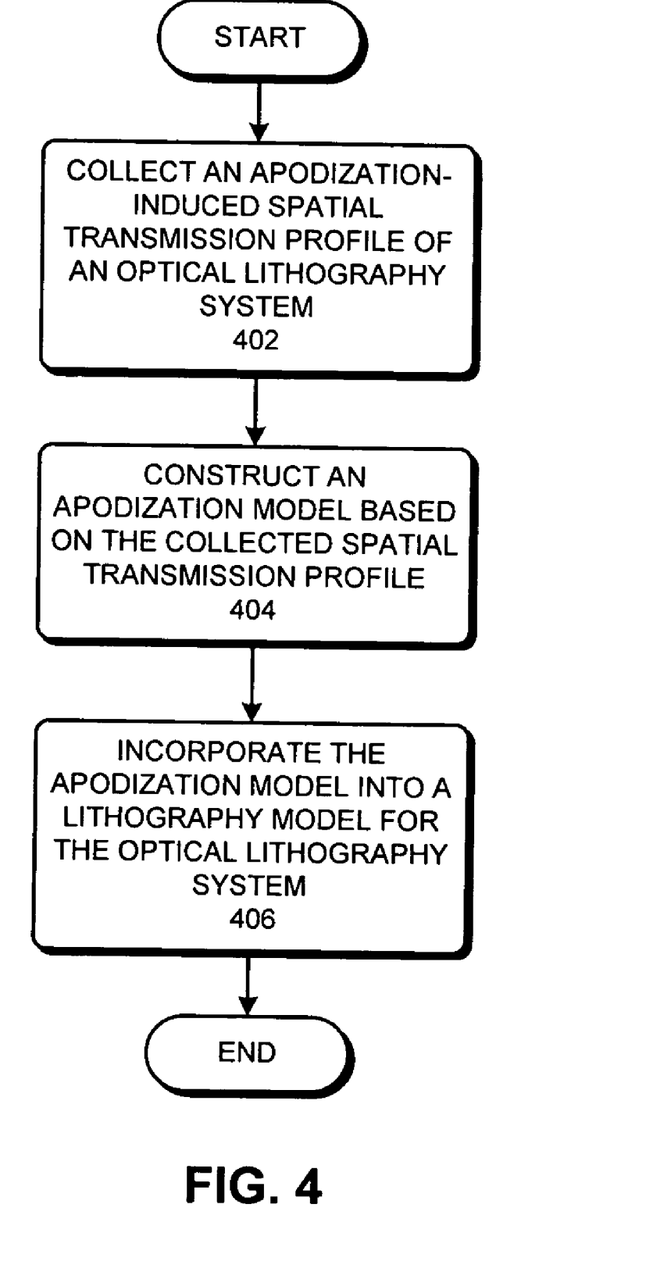
FIG. 4 presents a flowchart illustrating the process of modeling the apodization effect in an optical lithography system with an apodization model in accordance with an embodiment of the present invention.

FIG. 4 presents a flowchart illustrating the process of modeling the apodization effect in an optical lithography system with an apodization model in accordance with an embodiment of the present invention.

The process starts by collecting an apodization-induced spatial transmission profile from the optical lithography system (step 402). This involves measuring transmission coefficients at different locations within the lens pupil of the optical lithography system, which can involve mapping a transmission profile along a radial axis of the lens pupil. FIG. 3A depicts such a directly measured transmission profile, wherein the radial positions have been normalized with respect to the pupil radius.

The process then constructs an apodization model based on the collected spatial transmission profile (step 404). Specifically, we first introduce piece-wise apodization models which are based on radial-symmetric transmission profiles. These piece-wise apodization models further include a trapezoid apodization model and a step-wise apodization model. We then introduce a pixellized apodization model which is based on a 2D transmission profile. We finally proposal an enhanced (hyper) Gaussian apodization model as a direct improvement to the ideal Gaussian model. We describe these apodization models in more details below.

The process next incorporates the apodization model into a lithography model for the optical lithography system (step 406). More specifically, the process combines a lens pupil function of the optical lithography system with the apodization model. In one embodiment, the transmission through the optical lithography system can be expressed as:

Transmission=PupilFunction*ApodizationModelFunction.

One example of the pupil function model for lithography systems is referred to as a "radiometric correction" model (see Cole and Barouch, "Derivation and Simulating of Higher Numerical Aperture scalar Aerial Images," *Japan J Applied Physics.*, Vol 31, pp. 4110-4119, 1992.) In this model, transmission of the pupil function is given by:

$$\text{Transmission} = \left[\frac{1 - \frac{NA^2\rho^2}{Mag}}{1 - NA^2\rho^2}\right]^{\frac{1}{4}}, \quad (2)$$

wherein $\rho$ is the normalized radial position, which is 0 at the center of the pupil and 1 at the pupil edge. Mag is the demagnification factor, which is typically 1, 4, or 5 for IC lithographic application. Furthermore, the pupil transmission is 0 beyond the pupil extent.

Piece-Wise Apodization Models

Figure 5:
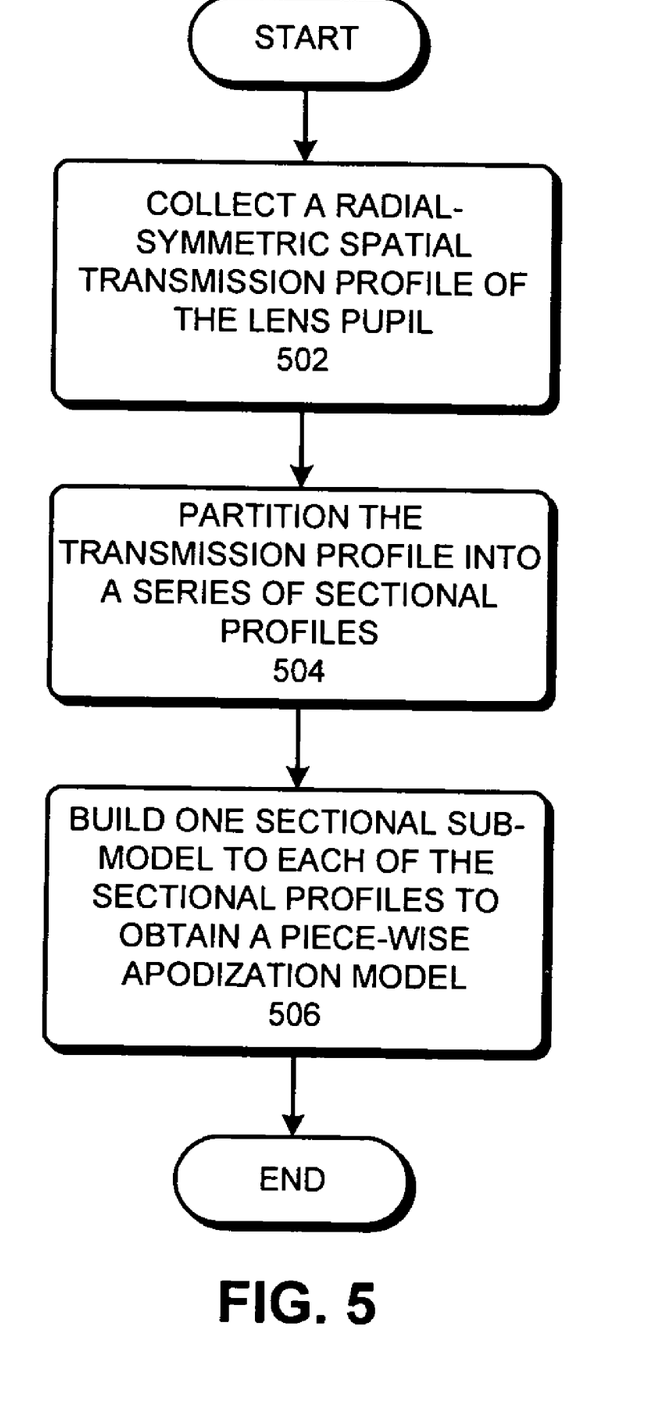
FIG. 5 presents a flowchart illustrating the process of modeling the apodization effect with a piece-wise apodization model in accordance with an embodiment of the present invention.

FIG. 5 presents a flowchart illustrating the process of modeling the apodization effect with a piece-wise apodization model in accordance with an embodiment of the present invention.

The process starts by collecting a radial-symmetric spatial transmission profile of the lens pupil (step 502). Because of the radial symmetry, the transmission profile can be represented as transmission versus a normalized pupil radial position $\rho$.

The process then partitions the transmission profile into a series of sectional profiles (step 504).

Next, the process constructs one sectional sub-model to each of the sectional profiles to obtain the piece-wise apodization model, which comprises a series of sectional sub-models stacked together (step 506). Specifically, each sectional sub-model used to fit a sectional transmission profile has a spatial attenuation profile which is substantially identical to the sectional transmission profile.

We describe different techniques for constructing different piece-wise apodization models below.

Trapezoid Apodization Model

Figure 6A:
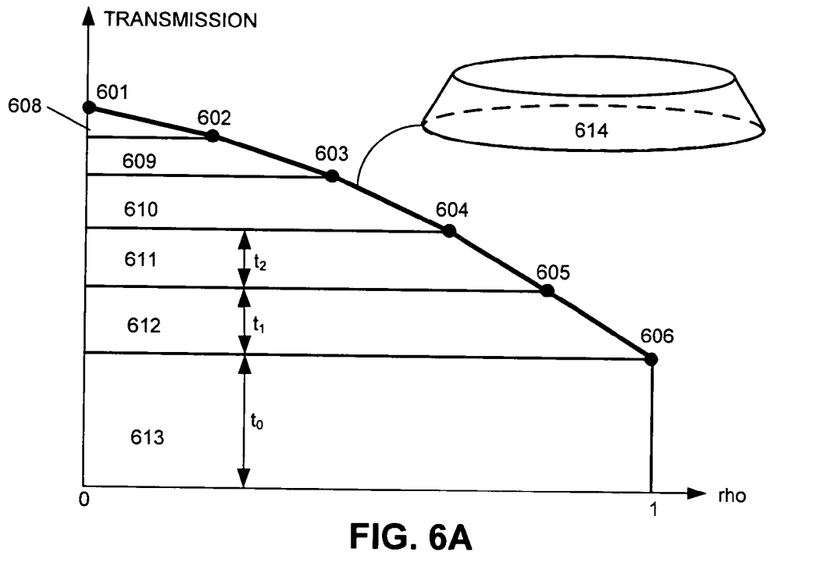
FIG. 6A illustrates the process of partitioning an apodization-induced transmission profile into trapezoids (i.e. tapered-edge disk) along the magnitude axis in accordance with an embodiment of the present invention.

FIG. 6A illustrates the process of partitioning an apodization-induced transmission profile into trapezoids (i.e. tapered-edge disk) along the magnitude axis in accordance with an embodiment of the present invention. Specifically, the process starts by identifying a set of data points (601 to 606) on the transmission profile. Next, a set of horizontal lines are drawn which originates from each of the data points and intersects with the magnitude axis of the transmission profile. Note that for the last data point with the maximum $\rho$ value (e.g., point 606 where $\rho$=1), a vertical line may be drawn to intersect the horizontal axis. Upon completing partitioning the transmission profile using the horizontal lines, the system creates a series of sectional trapezoid profiles 608-612. In this example, the sectional profile 613 at the bottom of the stack has a rectangular shape.

To construct a piece-wise apodization model, one embodiment of the present invention adds a sectional trapezoid sub-model for each of the trapezoid profiles, wherein the sectional trapezoid sub-model has an attenuation profile which is substantially identical to the associated sectional profile. Hence, a piece-wise trapezoid model for the apodization effect illustrated in FIG. 6A can be constructed by stacking a series of 2D trapezoid sub-models with attenuation properties substantially identical to the corresponding sectional transmission profile. Note that disk profile 613 is replaced with a disk filter function disk($\rho$, 1), which equals one for $0<\rho\leq1$, and zero for $\rho>1$.

In one embodiment of the present invention, a trapezoid filter function can be written as an one variable function of $\rho$:

trapFilt($\rho,\rho_1,\rho_2$), wherein $\rho_1$ and $\rho_2$ are two parameters corresponding to $\rho$ values at the two corners of the trapezoid sub-model. Hence, the overall apodization model—Apodiation can be expressed as:

Apodization=$t_0$*disk($\rho$,1)+$\Sigma t_i$*trapFilt$_i$($\rho,\rho_{i1},\rho_{i2}$), (3)

wherein $t_i$ is the a transmission scaling factor of the ith trapezoid sub-model. Both $t_0$ and $t_i$ can be obtained directly from the height of each trapezoid as illustrated in FIG. 6A.

Note that the transmission profile of FIG. 6A only illustrates one half of a cross-sectional view of a trapezoid sub-model in a two-dimensional (2D) space. Due to the radial symmetry of the transmission profile, a sectional trapezoid sub-model in a three-dimensional (3D) space is shown as an inset 614.

Figure 6B:
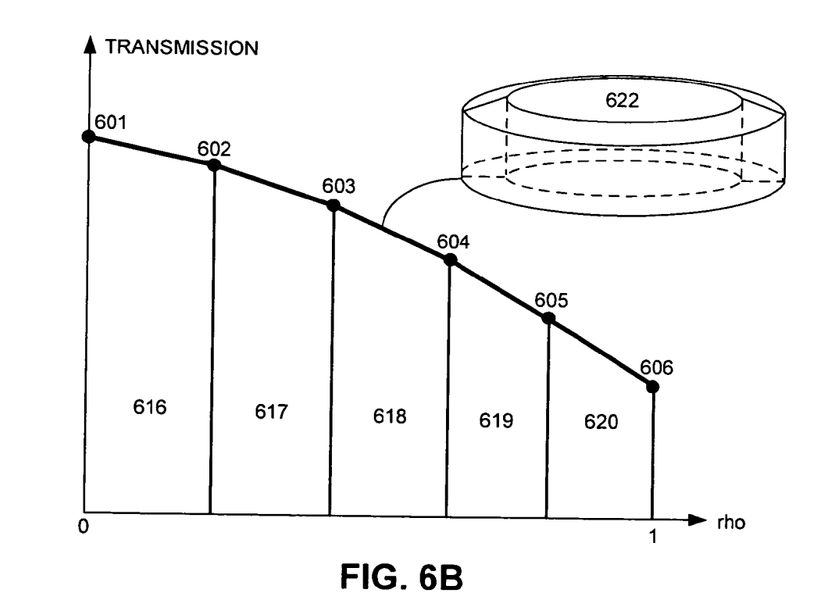
FIG. 6B illustrates the process of partitioning an apodization-induced transmission profile into trapezoids (i.e. annulus with tapered top edge) along a radial ($\rho$) direction in accordance with an embodiment of the present invention.

FIG. 6B illustrates the process of partitioning an apodization-induced transmission profile into trapezoids (i.e. annulus with tapered top edge) along a radial ($\rho$) direction in accordance with an embodiment of the present invention. In this embodiment, instead of drawing horizontal lines from points 601 to 606, a set of vertical partition lines are drawn to intersect with the radial axis $\rho$ of the transmission profile. Upon completing partitioning of the transmission profile, a series of vertical trapezoidal geometries are created, which are represented by trapezoids 616 to 620. Next, each trapezoid in the set of sectional transmission profiles is substituted by a sectional apodization sub-model. Finally, a piece-wise apodization model can be constructed by combining the set of adjacent sectional apodization sub-models.

Note that the transmission profile of FIG. 6B only illustrates one half of a cross-sectional view of a trapezoid sub-model in 2D space. Due to the radial symmetry of the transmission profile, the set of apodization sub-models in FIG. 6B represents a set of concentric annuli with top edge tapered in the 3D space. One of these annuli in the 3D space is shown as an inset 622.

Step-Wise Apodization Model

Figure 7A:
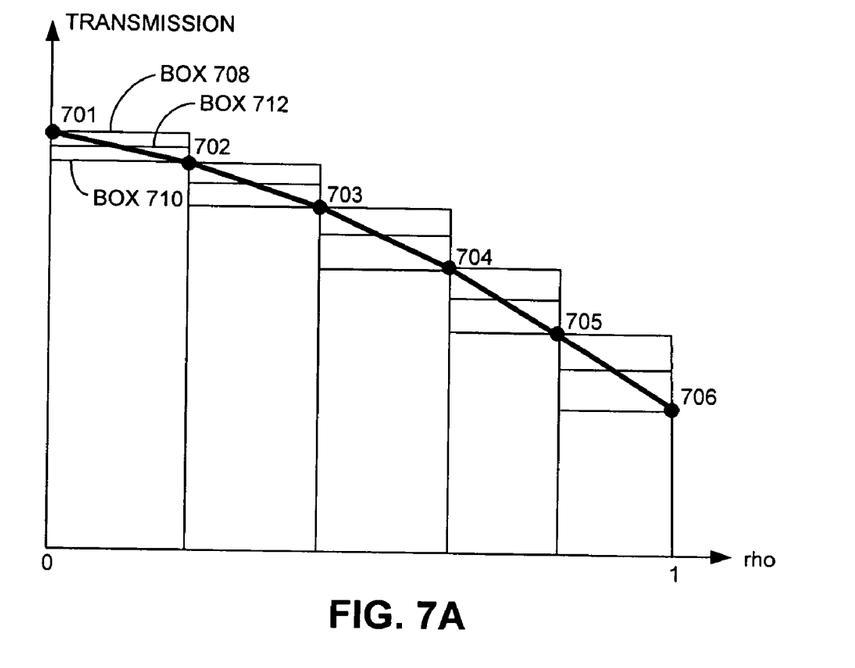
FIG. 7A illustrates the process of partitioning an apodization-induced transmission profile into step profiles along a radial direction in accordance with an embodiment of the present invention.

FIG. 7A illustrates the process of partitioning an apodization-induced transmission profile into step profiles along a radial direction in accordance with an embodiment of the present invention. Specifically, the process starts with identifying a set of data points (701 to 706) on the apodization-induced transmission profile. Next, using the set of data points as reference points, the transmission profile is divided up into a set of adjacent rectangular boxes. More specifically, the width of each rectangular box is the horizontal distance ($\rho$ values) between two adjacent data points, and the height of each rectangular box is defined by the corresponding transmission value of a data point.

Note that different choices can be made for the height of each rectangular box. As is illustrated in FIG. 7A, a first choice has a data point defining the upper left corner of a box (box 708), a second choice has a data point defining the upper right corner of a box (box 710), and a third choice selects an intermediate transmission value between two adjacent data points to define the height of the box (box 712). Each of these choices provides a certain degree of approximation to the original profile between two adjacent data points. Note that the first choice overestimates the transmission profile, whereas the second choice underestimates the transmission profile. In one embodiment of the present invention, the set of boxes used to approximate the transmission profile comprise only boxes of a single type as defined above. Note that if radial symmetry is assumed, the set of box in FIG. 7A represents a set of concentric rings in 3D space.

To construct an apodization model, one embodiment of the present invention specifies a sectional step-shape sub-model for each of the rectangular boxes, and therefore the sectional step-shape sub-model has substantially the same spatial attenuation profile as the corresponding sectional transmission profile. Hence, a step-wise apodization model is obtained to represent the apodization effect illustrated in FIG. 7A.

In one embodiment of the present invention, a step-shape sub-model can be written as:

$$g * stepFilter(\rho_1, \rho_2),$$

wherein $\rho_1$ and $\rho_2$ correspond to $\rho$ values of the two adjacent data points which define the width of the step-shape sub-model, and g is the gain (i.e., the transmission scaling factor) of the step-shape sub-model. Hence, the overall step-wise apodization model—Apodiation can be expressed as:

$$Apodization = \sum_{i=1}^{n} g_i * stepFilt_i(\rho_{i1}, \rho_{i2}), \quad (4)$$

wherein $\rho_{11} = 0$ and $\rho_{n2} = 1$.

Figure 7B:
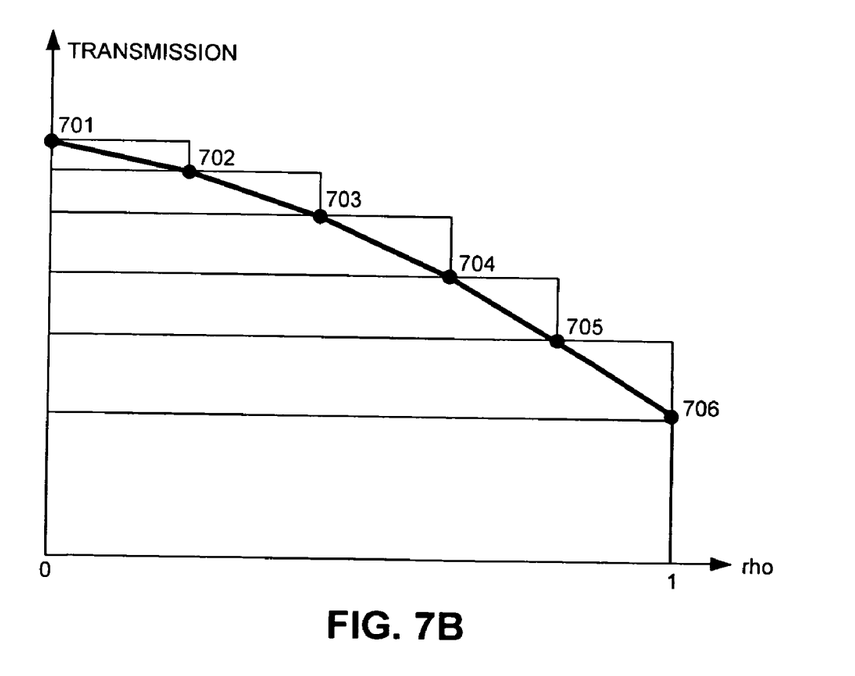
FIG. 7B illustrates the process of partitioning an apodization-induced transmission profile into step profiles along the magnitude axis in accordance with an embodiment of the present invention.

FIG. 7B illustrates the process of partitioning an apodization-induced transmission profile into step profiles along the magnitude axis in accordance with an embodiment of the present invention. In this embodiment, the partitioning process creates a stack of 2D rectangular boxes with geometries substantially identical to the corresponding sectional transmission profile. Note that the boxes can also have different widths as is illustrated in FIG. 7A.

Upon completing partitioning of the transmission profile, each rectangular box in the set of sectional transmission profiles is represented by a sectional step-shape sub-model. Finally, a step-wise apodization model is constructed by combining the set of sectional step-shape sub-model in similar manner as in FIG. 7A.

Although we have described piece-wise apodization models and step-wise apodization models which uses an exemplary transmission profile comprising six data points, any reasonable number of data points in the transmission profile may be used to partition the transmission profile. However, using more data points allows the transmission profile to be partitioned into more subsections, wherein each sectional profile represents a smaller portion of the profile.

Pixellized Apodization Model

The above described piece-wise apodization models assume radial symmetry in the pupil transmission profile. However, due to the imperfections in the lens, an actual transmission profile can also have asymmetries along different radial directions. In this case, it is insufficient to use radial-symmetrical apodization models to describe the apodization effect.

Figure 8:
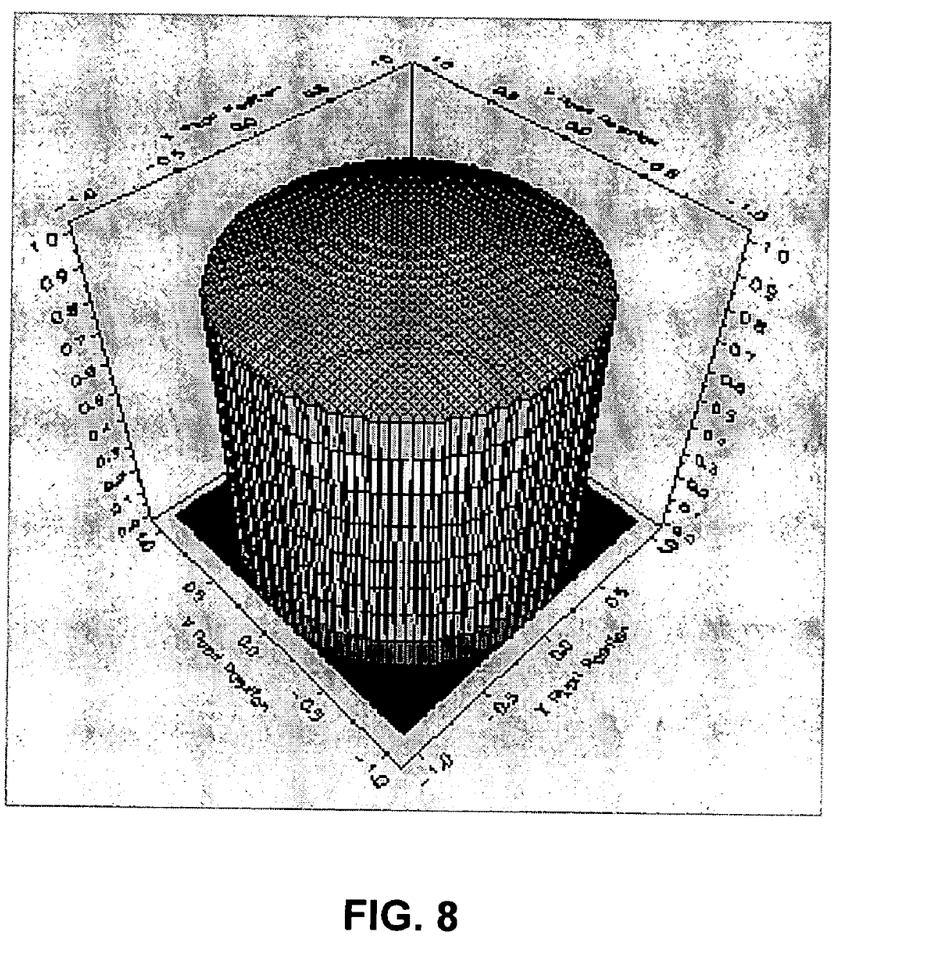
FIG. 8 illustrates an apodization-induced transmission profile wherein the transmission is measured in a pixellized 2D plane at the lens pupil in accordance with an embodiment of the present invention.

FIG. 8 illustrates an apodization-induced transmission profile wherein the transmission is measured in a pixellized 2D plane at the lens pupil in accordance with an embodiment of the present invention. In this embodiment, a 2D transmission profile is obtained by measuring transmission at each pixel location within the 2D pixellized plane at the lens pupil. The measured 2D transmission profile can be expressed in either a radial coordinate form as f(r, θ), or in Cartesian coordinate form as f(x, y). Next, a 2D pixellized apodization can be obtained by directly converting the 2D transmission profile into a pixellized 2D filter. This pixellized 2D filter has an attenuation factor at each pixel location equal to the corresponding transmission value at that location. Note that this technique can be used to model a 2D transmission profile of any complexity.

Enhanced (Hyper) Gaussian Model

An enhanced (Hyper) Gaussian model provides a substantial improvement to the ideal Gaussian model described earlier. In the enhanced Gaussian model, the apodization effect Apodization can be expressed as:

$$Apodization = e^{-C(\rho \cdot \sigma)^n}, \quad (5)$$

wherein $\rho$ is the normalized radial position of the pupil, and C is a predetermined positive value. In one embodiment, C is chosen to be 0.5.

This enhanced Gaussian model further comprises two tunable parameters, σ and n, wherein n controls the roll-off rate of the apodization-induced attenuation profile, and σ is similar to the Gaussian Sigma σ in the ideal Gaussian model.

After the apodization-induced pupil transmission modulation has been collected, the enhanced Gaussian model is fitted to the empirical data to determine the values of both tunable parameters σ and n. In one embodiment of the present invention, a least-squares regression technique is used to fit the enhanced Gaussian model.

Figure 9A:
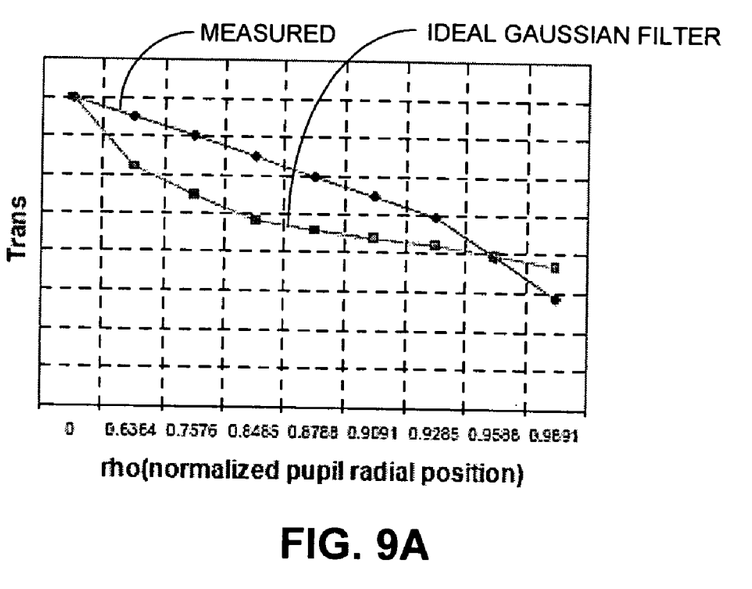
FIG. 9A illustrates both the measured transmission attenuation profile and the fitted curve based on an ideal Gaussian model in accordance with an embodiment of the present invention.

FIG. 9A illustrates both the measured transmission attenuation profile and the fitted curve based on an ideal Gaussian model in accordance with an embodiment of the present invention. Note that the modeled transmission attenuation using the fitted ideal Gaussian model does not match well with the measured one. Also note that the low spatial frequency components (i.e., smaller ρ values) are attenuated more heavily in the ideal Gaussian model than the measured data.

Figure 9B:
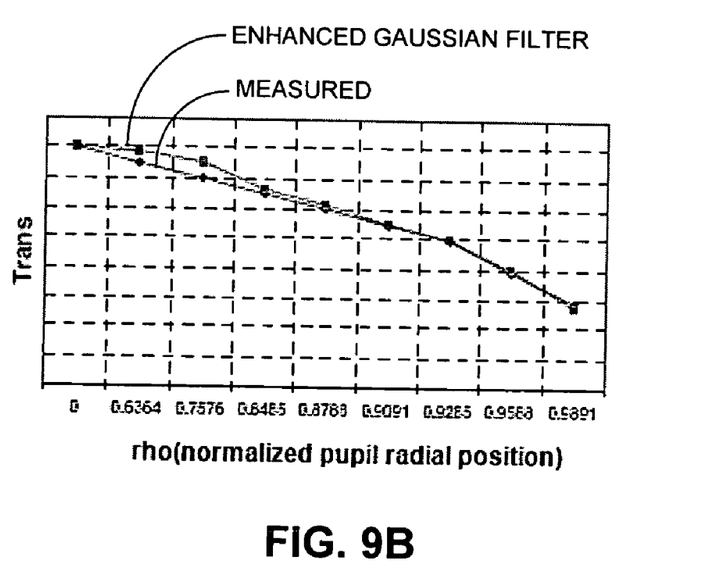
FIG. 9B illustrates both the measured transmission attenuation profile and the fitted curve based on an enhanced (i.e. a hyper) Gaussian model in accordance with an embodiment of the present invention.

FIG. 9B illustrates both the measured transmission attenuation and the fitted curve based on an enhanced (i.e. hyper) Gaussian model in accordance with an embodiment of the present invention. Note that by using the 2-parameter enhanced Gaussian model, the fitted curve provides an accurate prediction of the measured data, particularly at the high spatial frequency components (i.e., large ρ values). Also note that by introducing the roll-off control parameter n, this 2-parameter enhanced Gaussian model can better capture the physics of the apodization-effect.

Application to Pellicle Film Induced Transmission Attenuation

In optical lithography system in FIG. 2A, mask 206 is typically protected against contaminations by using a thin pellicle film attached to the mask through a metal frame. This pellicle film is highly transparent, and therefore ideally an exposure light can pass through the film onto the projection lens with minimum uniform attenuation. However, it has been found that typical organic pellicle films used in the lithography process can cause frequency-dependent transmission losses (see K. Lucas, J. Gordon, et. al. "Optical issues of thin organic pellicles in 45 nm and 32 nm immersion lithography", Proceedings of SPIE BACUS, vol. 6349, 2006.) In particular, pellicle film induced transmission attenuation causes a loss of critical high spatial frequency information during the imaging process, which can be related to the attenuation behavior in the apodization effects.

However, the frequency-dependent mask transmission attenuation induced by the pellicle film is typically ignored in current lithography and OPC modeling tools. Similar to overlooking the apodization effects, ignoring pellicle film effects can put the fidelity and stability of the final OPC model at risk through distorting other tunable empirical models (e.g. resist and etch models) to compensate for the absence of an appropriate pellicle transmission model. A number of 45 nm-node simulations have shown that a larger than 5 nm CD error can be expected if the pellicle film's transmission property is ignored.

In one embodiment of the present invention, all the techniques for modeling an apodization effect described-above are applicable to the modeling of pellicle film induced transmission attenuation. Specifically, a pellicle film-induced transmission profile can be experimentally obtained for the mask, and a pellicle film model can be constructed based on this transmission profile.

Consequently, piece-wise pellicle film models can be constructed in the same manner as the piece-wise apodization models (including both trapezoid models and step-wise models) and a pixellized pellicle film model can be constructed in the same manner as the pixellized apodization model. Moreover, because of the similar roll-off characteristics in their corresponding frequency-dependent transmission attenuation profiles, an enhanced (hyper) Gaussian pellicle film model can be constructed in the same manner, as the enhanced (hyper) Gaussian Apodization model, which has the same form as Equation (5).

CONCLUSION

Note the above-described apodization/pellicle film models incorporate a physical data-driven modeling approach, and hence can truthfully match pupil apodization effects and pellicle film effects. These models can be incorporated into an optical lithography model, which is subsequently used in an OPC process. Experimental data shows that these models can significantly improve the OPC model accuracy and reduce CD errors.

In one embodiment of the present invention, each proposed apodization/pellicle film model can be constructed independently without requiring regression with other OPC model parameters. Consequently, during a subsequent OPC regression process, the models for pupil apodization and the pellicle film can be frozen and only the necessary empirical resist/etch model parameters are regressed to fit the OPC model to the measurement data. This OPC modeling approach facilitates achieving high model fidelity and accuracy, and avoiding model over-fitting which can occur with too many fitting parameters in the empirical model or by distorting empirical models to compensate for the inaccuracy or absence of pupil apodization model and/or pellicle transmission model. In this embodiment, once the apodization and pellicle models have been constructed for a given lithography system, these models can be fixed and can be used in a deterministic manner thereafter.

In another embodiment of the present invention, each proposed apodization/pellicle film model can be constructed through regression (against its parameters) during the OPC model regression with other process models. This is particularly useful when measured apodization/pellicle film transmission profile is not available. Note that because each proposed model is inherently more accurate than the ideal Gaussian model, such a regression can still get a better overall OPC model.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A method for accurately predicting an apodization effect in an optical lithography system for manufacturing an integrated circuit, the method comprising:
collecting an apodization effect induced spatial transmission profile from the optical lithography system;
using one or more computers for:
constructing an apodization model based on the spatial transmission profile, which involves fitting an enhanced Gaussian model based on the spatial transmission profile, wherein the enhanced Gaussian model is proportional to $e^{-C(\rho \cdot \sigma)^n}$, wherein $\rho$ is a normalized radial position, $\sigma$ and $n$ are fitting parameters, $\sigma$ is the Gaussian Sigma, n controls an attenuation rate of a transmission coefficient, and C is a predetermined positive value; and
enhancing a lithography model for the optical lithography system by incorporating the apodization model into the lithography model,
wherein the enhanced lithography model accurately predicts the effects of apodization on the optical lithography system.

2. The method of claim 1, wherein collecting the spatial transmission profile involves measuring transmission coefficient at a lens pupil of the optical lithography system.

3. The method of claim 2, wherein measuring the transmission coefficient at the lens pupil of the optical lithography system involves mapping a transmission profile along a radial direction of the lens pupil.

4. The method of claim 3, wherein constructing the apodization model based on the spatial transmission profile involves constructing a piece-wise apodization model based on the transmission profile.

5. The method of claim 3, wherein constructing the piece-wise apodization model based on the transmission profile involves:
partitioning the transmission profile into a series of sectional profiles; and
fitting a sectional sub-model to each of the sectional profiles to obtain the piece wise apodization model, which comprises a series of sectional sub-models.

6. The method of claim 5, wherein the sectional sub-model can include:
a trapezoid sub-model; and
a step-shape sub-model.

7. The method of claim 5, wherein partitioning the transmission profile involves:

partitioning the transmission profile along the magnitude direction of the transmission profile; or partitioning the transmission profile along the radial direction of the transmission profile.

8. The method of claim 2, wherein measuring the transmission coefficient at the lens pupil of the optical lithography system involves mapping a two-dimensional (2D) transmission profile into a pixellized transmission profile at the lens pupil.

9. The method of claim 8, wherein constructing the apodization model based on the transmission profile involves constructing a pixellized 2D apodization model based on the 2D transmission profile.

10. The method of claim 1, wherein enhancing the lithography model using the apodization model involves incorporating the apodization model into a lens pupil function of the optical lithography system.

11. The method of claim 1, further comprising using the enhanced lithography model in an optical proximity correction (OPC) process, wherein the enhanced lithography model comprises a fixed apodization model.

12. A computer readable storage device storing instructions that when executed by a computer cause the computer to perform a method for accurately predicting an apodization effect in an optical lithography system for manufacturing an integrated circuit, the method comprising:
collecting an apodization effect induced spatial transmission profile from the optical lithography system;
constructing an apodization model based on the spatial transmission profile, which involves fitting an enhanced Gaussian model based on the spatial transmission profile, wherein the enhanced Gaussian model is proportional to $e^{-C(\rho \cdot \sigma)^n}$, wherein $\rho$ is a normalized radial position, $\sigma$ and $n$ are fitting parameters, $\sigma$ is the Gaussian Sigma, $n$ controls an attenuation rate of a transmission coefficient, and $C$ is a predetermined positive value; and
enhancing a lithography model for the optical lithography system by incorporating the apodization model into the lithography model,
wherein the enhanced lithography model accurately predicts the effects of apodization on the optical lithography system.

13. The computer readable storage device of claim 12, wherein collecting the spatial transmission profile involves measuring transmission coefficient at a lens pupil of the optical lithography system.

14. The computer readable storage device of claim 13, wherein measuring the transmission coefficient at the lens pupil of the optical lithography system involves mapping a transmission profile along a radial direction of the lens pupil.

15. The computer readable storage device of claim 14, wherein constructing the apodization model based on the spatial transmission profile involves constructing a piece-wise apodization model based on the transmission profile.

16. The computer readable storage device of claim 15, wherein constructing the piece-wise apodization model based on the transmission profile involves:

partitioning the transmission profile into a series of sectional profiles; and
fitting a sectional sub-model to each of the sectional profiles to obtain the piece wise apodization model, which comprises a series of sectional sub-models.

17. The computer readable storage device of claim 16, wherein the sectional sub-model can include:
a trapezoid sub-model; and
a step-shape sub-model.

18. The computer readable storage device of claim 16, wherein partitioning the transmission profile involves:
partitioning the transmission profile along the magnitude direction of the transmission profile; or
partitioning the transmission profile along the radial direction of the transmission profile.

19. The computer readable storage device of claim 13, wherein measuring the transmission coefficient at the lens pupil of the optical lithography system involves mapping a two-dimensional (2D) transmission profile into a pixellized transmission profile at the lens pupil.

20. The computer readable storage device of claim 19, wherein constructing the apodization model based on the transmission profile involves constructing a pixellized 2D apodization model based on the 2D transmission profile.

21. The computer readable storage device of claim 12, wherein enhancing the lithography model using the apodization model involves incorporating the apodization model into a lens pupil function of the optical lithography system.

22. The computer readable storage device of claim 12, further comprising using the enhanced lithography model in an optical proximity correction (OPC) process, wherein the enhanced lithography model comprises a fixed apodization model.

23. An apparatus that accurately predicts an apodization effect in an optical lithography system for manufacturing an integrated circuit, comprising:
a collecting mechanism configured to collect an apodization effect-induced spatial transmission profile from the optical lithography system;
a constructing mechanism configured to construct an apodization filter model based on the spatial transmission profile, which involves fitting an enhanced Gaussian model based on the spatial transmission profile, wherein the enhanced Gaussian model is proportional to $e^{-C(\rho \cdot \sigma)^n}$, wherein $\rho$ is a normalized radial position, $\sigma$ and $n$ are fitting parameters, $\sigma$ is the Gaussian Sigma, $n$ controls an attenuation rate of a transmission coefficient, and $C$ is a predetermined positive value; and
an incorporating mechanism configured to enhance a lithography model for the optical lithography system by incorporating the apodization model into the lithography model, wherein the enhanced lithography model accurately predicts the effects of apodization on the optical lithography system.

* * * * *

UNITED STATES PATENT AND TRADEMARK OFFICE
CERTIFICATE OF CORRECTION

PATENT NO.         : 7,681,172 B2                                         Page 1 of 1
APPLICATION NO. : 11/699805
DATED              : March 16, 2010
INVENTOR(S)        : Qiaolin Zhang et al.

It is certified that error appears in the above-identified patent and that said Letters Patent is hereby corrected as shown below:

In claim 5 (at column 12, line 54), please replace the letter "3" with the letter --4-- so the line reads: --The method of claim 4, wherein constructing the piece--.

Signed and Sealed this

Eleventh Day of May, 2010

David J. Kappos
*Director of the United States Patent and Trademark Office*